United States Patent [19]

Asanasavest

[11] Patent Number: 5,607,096
[45] Date of Patent: Mar. 4, 1997

[54] APPARATUS AND METHOD FOR ULTRASONIC BONDING LEAD FRAMES AND BONDING WIRES IN SEMICONDUCTOR PACKAGING APPLICATIONS

[75] Inventor: Chainarong Asanasavest, Santa Clara, Calif.

[73] Assignee: National Semiconductor Corporation, Santa Clara, Calif.

[21] Appl. No.: 613,023

[22] Filed: Mar. 11, 1996

[51] Int. Cl.$^6$ .......................... B23K 20/10; H01L 21/607
[52] U.S. Cl. ........................ 228/1.1; 228/102; 228/110.1
[58] Field of Search .......................... 228/1.1, 8, 9, 102, 228/110.1; 73/579, 582; 156/73.1, 580.1

[56] References Cited

U.S. PATENT DOCUMENTS

| | | | |
|---|---|---|---|
| 3,794,236 | 2/1974 | Salzer et al. | 73/579 |
| 4,854,494 | 8/1989 | Von Raben | 228/102 |
| 5,170,929 | 12/1992 | Long et al. | 228/102 |
| 5,285,946 | 2/1994 | Tomigashi et al. | 228/9 |

*Primary Examiner*—Samuel M. Heinrich
*Attorney, Agent, or Firm*—Hickman Beyer & Weaver

[57] ABSTRACT

An ultrasonic bonder for coupling lead frame leads to associated traces on a substrate is disclosed. In one aspect of the invention, the bonder includes an ultrasonic transducer. A base supports the transducer at one end, while a bonding tool is attached to the other end. The bonding tool is suitably sized for engaging a lead frame lead to facilitate connecting the lead frame lead to an associated trace on a substrate. A pair of force sensors are positioned on opposite sides of the transducer's longitudinal axis. Each force sensor has a sensor axis that is arranged at an acute angle relative to the longitudinal axis of the transducer for detecting the forces applied to the bonding tool and for outputting a force signal indicative of the detected forces. A controller receives the force signals and outputs a drive signal to the transducer to facilitate mechanically bonding the selected lead frame lead to its associated trace. The bonding tool being secured to the bonding tool end of the transducer such that actuation of the transducer will cause movement of the bonding tool. The outputted drive signal is controlled at least in part on the basis of the received force signals. An ultrasonic bonder for coupling an integrated circuit die to associated wiring traces is also disclosed. Additionally, methods of ultrasonic bonding and packaging of semiconductor devices using the described bonder are disclosed.

22 Claims, 3 Drawing Sheets

APPARATUS AND METHOD FOR ULTRASONIC BONDING LEAD FRAMES AND BONDING WIRES IN SEMICONDUCTOR PACKAGING APPLICATIONS

BACKGROUND OF THE INVENTION

The present invention relates generally to ultrasonic bonding in semiconductor packaging applications. More particularly, an improved method and apparatus for adjusting the bonding parameters based upon multidimensional feedback is disclosed.

In semiconductor packaging, lead frames are commonly used to couple a die to external components. Most commonly, the bonding pads on the dies are electrically coupled to associates leads on the lead frame using bonding wires. One end of each bonding wire is typically ultrasonically bonded to a die pads on the die and the opposite end is typically bonded to an associated lead. In some applications (particularly small high lead count packages) it may be desirable or necessary to use an interposer in conjunction with the lead frame. The interposer is similar to a mini printed circuit board. A conventional method for connecting a bonding pad to an associated lead via an interposer is commonly referred to as lead frame-interposer integration. The bonding wires are typically ultrasonically bonded to their associated contacts. In contrast, during lead frame-interposer integration, the leads of a lead frame are bonded directly onto the traces on an interposer. For example, an overlapping lead and its associated trace are ultrasonically bonded at a single point.

Referring initially to FIG. 1, a conventional ultrasonic bonder arrangement that is suitable for lead frame-interposer integration will be schematically described. The bonder 100 has a bonding tool 112, a transducer 110 having a support section 118, a base 122, a plurality of fasteners 114, a plurality of mount holes 116, and a plurality of base holes 120. The bonding tool 112 is attached to one end of the transducer 110, while the base 122 is attached to the other end of the transducer 110. The transducer 110 is attached to the base 122 by inserting each fastener 114 into a mount hole 116 within the support section 118 and then into a base hole 120 within the base 122.

Referring now to FIG. 2, the lead frame-interposer integration process will now be described. During lead frame-inter poser integration, the bonding tool 112 is used to ultrasonically bond a lead 124 directly onto an associated trace 128 on the interposer 126. For a bond to occur, the bonding surfaces (lead 124 and trace 128) need to be in direct contact during the ultrasonic bonding. Additionally, the bonding surfaces must remain motionless with respect to each other. The ultrasonic energy 132 is then transmitted through the lead 128 to the underlying trace 128 on the interposer 126. In effect, the ultrasonic mechanical vibration 132 of the bonding tool 112 is translated into molecular vibration 130 in the lead 124 and the trace 128. This molecular movement 130 results in an intermetallic bond between the lead and trace.

During a wire bonding process (not shown), in contrast to a lead frame-interposer integration process, the bonding tool takes the form of a capillary that is firmly secured by a capillary holder by a lock screw and is arranged to feed a bonding wire as necessary. Typically, the distal end of the bonding wire is initially ultrasonically bonded to a die pad on an integrated circuit. This is typically accomplished by a process known as ball bonding. When the first end of the bonding wire is firmly adhered to the die pad, the transducer and capillary arrangement is moved to a position over a lead of the lead frame. As the transducer is moved, the bonding wire is fed through the capillary. The bonding wire is then ultrasonically bonded to the associated lead and the continuous feed wire is cut off so that a short and discrete bonding wire is formed between the die pad and the lead. The ultrasonic bonding to the lead is typically done by a process referred to as stitch bonding.

Unfortunately, these conventional bonding systems and processes have certain drawbacks. First, the high power required for bonding certain thick materials can also destroy intermetallic formation if the power is applied to the bonding material for too long a time period. This problem is especially prevalent in lead frame-interposer integration since the ultrasonic energy must be great enough to be transferred through the relatively thick lead to the trace on the interposer. Second, various ultrasonic energy levels are required for different bonding configurations. For example, when the lead's longitudinal axis is parallel to the direction of the bonding tool's movement, more energy could be applied than when the lead's axis is perpendicular. This factor complicates the determination of the proper bonding duration before destruction occurs. Thus, a way to improve the controlling mechanism of the bonding duration of these bonding systems is highly desirable.

SUMMARY OF THE INVENTION

To achieve the foregoing and other objects and according to the purpose of the present invention, an ultrasonic bonder for coupling lead frame leads to associated traces on a substrate is disclosed. In one aspect of the invention, the bonder includes an ultrasonic transducer. A base supports the transducer at one end, while a bonding tool is attached to the other end. The bonding tool is suitably sized for engaging a lead frame lead to facilitate connecting the lead frame lead to an associated trace on a substrate. The bonding tool is secured to the bonding tool end of the transducer such that actuation of the transducer will cause movement of the bonding tool. A pair of force sensors are positioned on opposite sides of the transducer's longitudinal axis. Each force sensor has a sensor axis that is arranged at an acute angle relative to the longitudinal axis of the transducer for detecting the forces applied to the bonding tool and for outputting a force signal indicative of the detected forces. A controller receives the force signals and outputs a drive signal to the transducer to facilitate mechanically bonding the selected lead frame lead to its associated trace. The drive signal is controlled at least in part on the basis of the received force signals.

In a preferred embodiment, the controller includes a plurality of amplifiers with each amplifier being arranged for receiving an associated force signal and outputting an amplified signal. An analyzer receives the amplified signals from the amplifiers, determines a bonding quality value based on the analysis of the amplified signals, and outputs an analyzer result. A signal generator receives the analyzer result from the analyzer and applies the drive signal to the transducer. The signal generator is arranged to permit actuation of the transducer at drive signal values suitable for ultrasonic bonding based on the analyzer result. In a preferred embodiment, when the magnitudes decrease a predetermined amount and are detected by the controller, the controller terminates the transducer's bonding movement.

In yet another aspect of the invention, an improved wire bonder for coupling an integrated circuit die to associated wiring traces is disclosed. The wire bonder includes an ultrasonic transducer. A base supports the transducer at one end, while a capillary holder is attached to the other end. The capillary has a bonding wire suitable for electrically connecting a die pad of the integrated circuit die to an associate wiring trace. The capillary holder is secured to the transducer such that actuation of the transducer will cause movement of the capillary supported by the capillary holder. A pair of force sensors are positioned on opposite sides of the transducer's longitudinal axis. Each force sensor has a sensor axis that is arranged at an acute angle relative to the longitudinal axis of the transducer for detecting the forces applied to the bonding tool and for outputting a force signal indicative of the detected forces. A controller receives the force signals and outputs a drive signal to the transducer to facilitate mechanically bonding the selected lead frame lead to its associated trace. The drive signal is controlled at least in part on the basis of the received force signals.

In a method aspect of the invention, a lead of a lead frame is ultrasonically bonded to an associated trace on a substrate. The ultrasonic bonding is initiated at a first ultrasonic energy value and the bonding forces are detected and analyzed during such bonding. The bonding quality is dynamically determined based on the forces and the magnitude of the bonding power is controlled based upon the detected forces.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
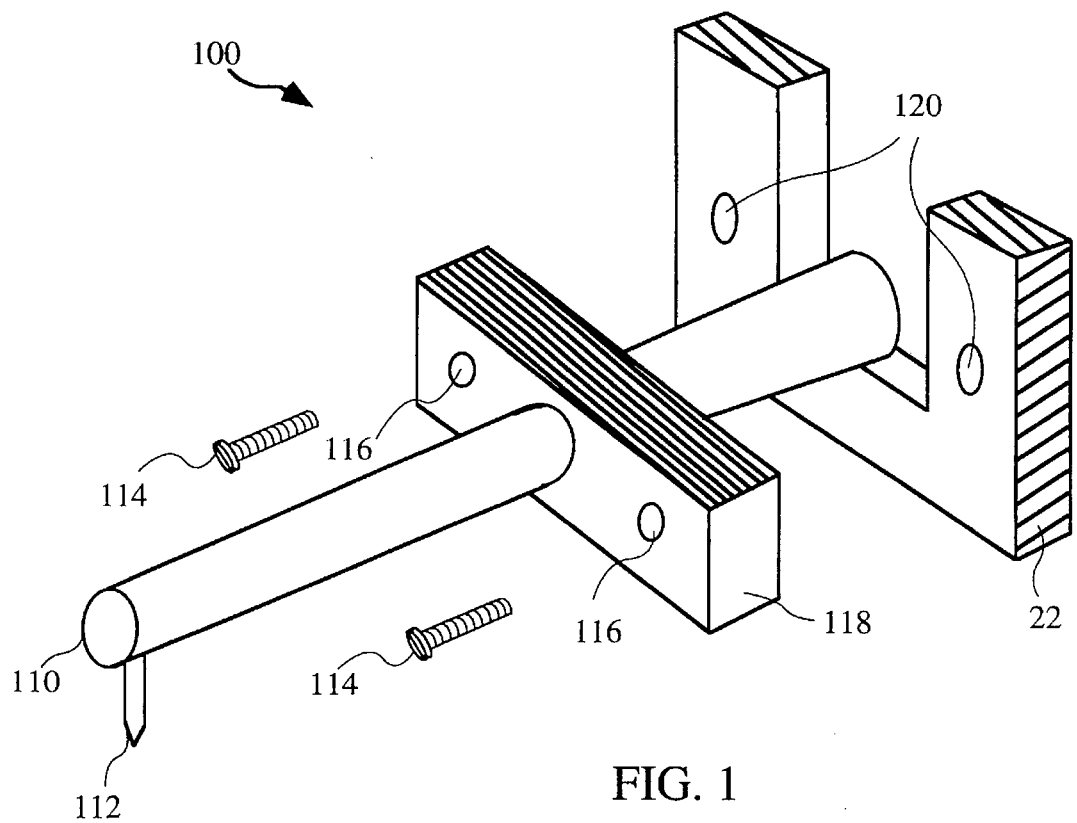
FIG. 1 is a perspective view of a conventional bonder arrangement.
Figure 2:
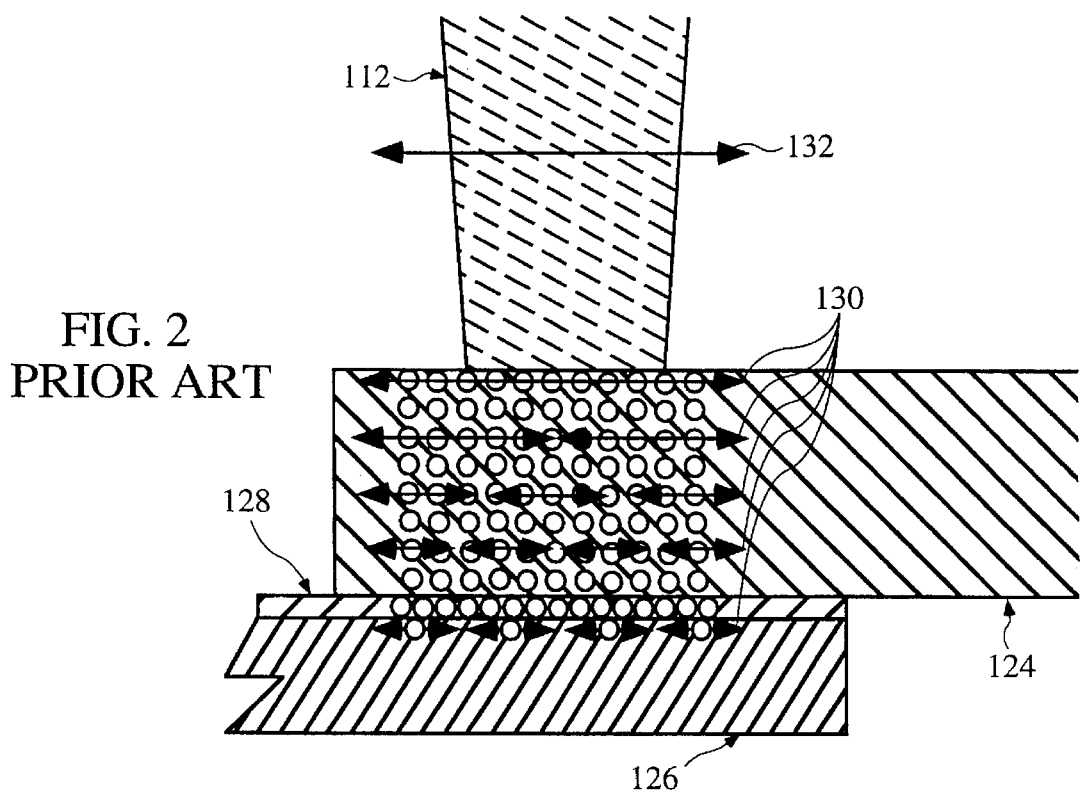
FIG. 2 is a diagrammatic side view of a conventional lead frame-interposer integration configuration that illustrates the bonding process.
Figure 3:
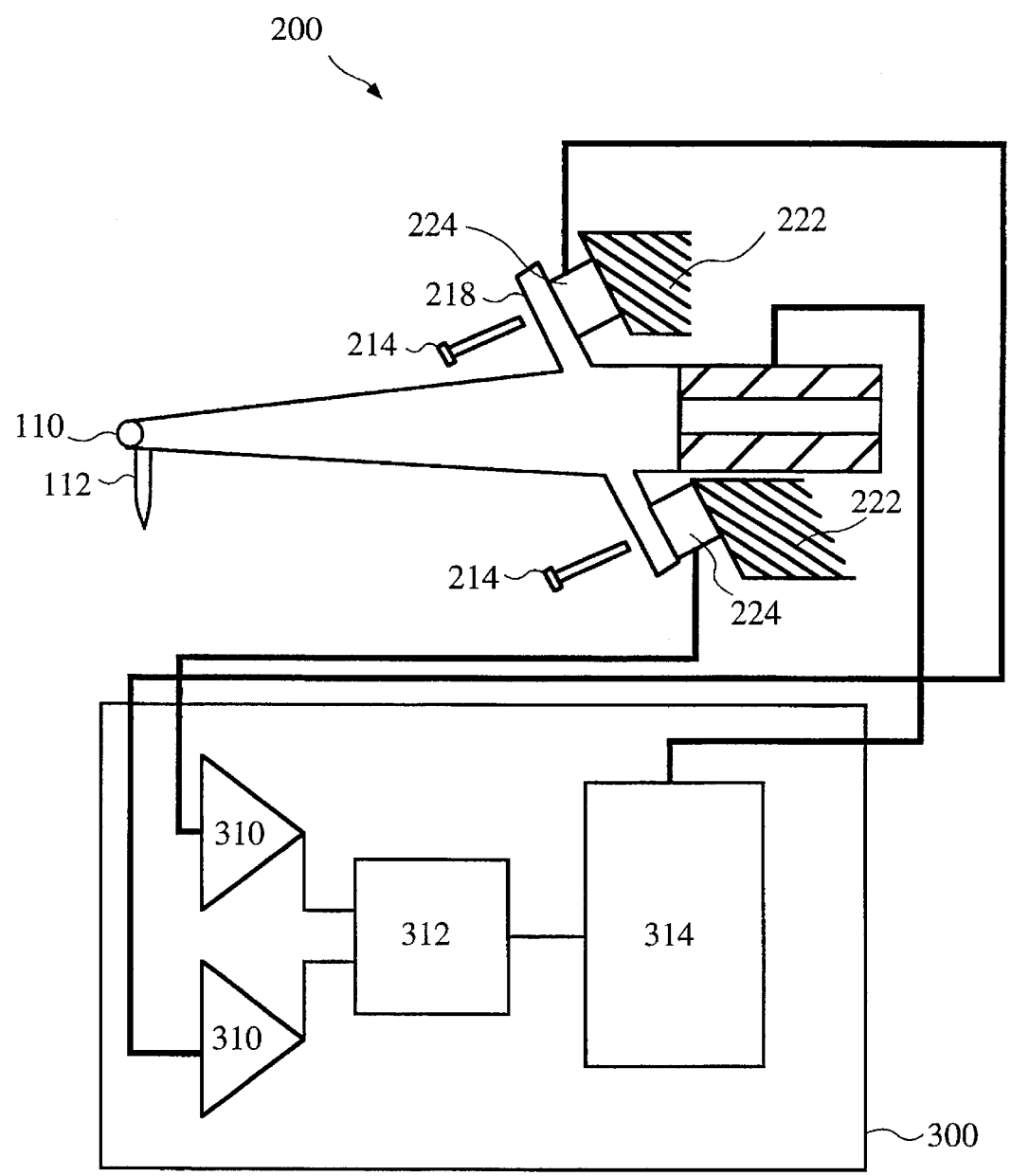
FIG. 3 is a diagrammatic side view of a bonder arrangement in accordance with an embodiment of the present invention.

Referring initially to FIG. 3, a bonder arrangement that is suitable for lead frame-interposer integration in accordance with one embodiment of the present invention will be described. The bonder arrangement 200 includes a bonding tool 112, a transducer 110, a support section 218, a base 222, two fasteners 214, two force sensors 224, and a controller 300. The bonding tool 112 is attached to one end of the transducer 110, while the base 222 is attached to the other end of the transducer 110. The force sensors 224 are mounted between the support section 218 and the base 222 by use of the fasteners 214. The controller 300 is electrically connected to the force sensors 224 and the transducer 110.

The bonder transducer converts electrical power to mechanical vibration. Any suitable conventional bonder transducer may be used as transducer 110. By way of example, conventional bonder transducers such as K&S 1484 bonder piezoelectric transducers, available from Kulick and Soffar Industries, Inc. work well. Alternatively, a custom designed transducer may be used. The force sensors are transducers that convert mechanical vibration into electrical signals. Thus, any suitable conventional piezoelectric transducers may be used as force sensors 224.

The force sensors 224 are mounted so that all force vector values that are applied to the bonding tool 112 (including x, y, and z force vectors) can be detected by the force sensors 224. Typically, the force sensors are mounted such that they are co-planer, although this is not a requirement. For example, one force sensor is mounted above the transducer at an acute angle from the transducer's longitudinal axis while the other force sensor is mounted below the transducer at an acute angle from the transducer's longitudinal axis. Each force sensor 224 detects and outputs a different force signal to the controller 300. Each force signal represents the vector addition of the component forces applied on the bonding tool for a particular angle from the transducer axis. The controller 300 analyzes these force signals to indirectly determine the bond quality. Specifically, the force signals' magnitude and timing are directly related to the bond quality. The controller 300 then outputs a drive signal to the transducer 110 based upon the determined bond quality. In a preferred embodiment, when the controller determines by means of the determined bond quality that bonding is complete, the drive signal and resulting transducer movement are terminated.

In a preferred embodiment, the controller 300 includes two amplifiers 310, an analyzer 312, and a signal generator 314. Each amplifier receives a distinct force signal from one of the two force sensors 224. Each amplifier outputs an amplified signal to the analyzer 312. The analyzer 312 determines the bond quality based on the values of the amplified signals input from each amplifier 310. The analyzer outputs an analyzer result to the signal generator 314. The signal generator 314 determines and outputs a drive signal to the transducer 110. The drive signal is based on the bond quality. For example, the drive signal's magnitude, phase, and timing may depend upon the bond quality.

A wide variety of drive signals may be used depending primarily on the type of transducer used. By way of example, a sinusoidal drive signal in the ultrasonic range works well. Of course, the waveform of the drive signal may vary widely in accordance with the needs of a particular system.

In summary, when activated by the drive signal, the transducer 110 tends to vibrate. Movement of the transducer 110 translates to movement of the bonding tool 112. The bonding tool 112, in turn, applies forces to the lead during bonding. The value of these forces also depend on the quality of the bond. By measuring and analyzing the forces applied at the bonding tool, the bonding quality may be indirectly determined. After the bond quality is determined, the drive signal may be set to an appropriate value by the controller 300.

For a wire bonding process, a wire bonder arrangement is substantially similar to the previously described bonder arrangement for lead frame-interposer integration. In a like manner, a wire bonder in accordance with the present invention will include a bonding tool 112, a transducer 110, a support section 218, a base 222, two fasteners 214, two force sensors 224, and a controller 300. However, some of the wire bonder's components will take forms that are specifically suitable for wire bonding. For example, the bonding tool preferably takes the form of a capillary that is firmly secured by a capillary holder by a lock screw and is arranged to feed a bonding wire as necessary (not shown).

Figure 4:
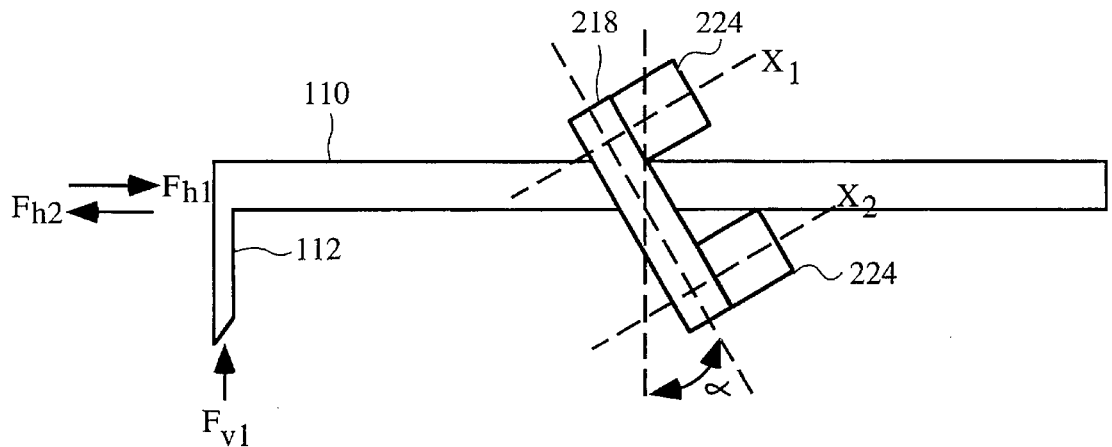
FIG. 4 is an illustration of the direction of the forces that are applied to the bonding site.
Figure 4:
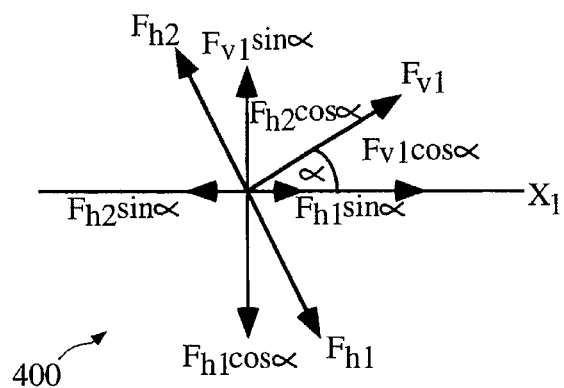

Referring now to FIG. 4, an example of the force vectors that are indirectly measured by the force sensors 224 and analyzed by the analyzer circuit 312 will now be described. The forces applied to the bonding tool 112 are $F_{H1}$, $F_{H2}$, and $F_{V1}$. These forces are dependent on, among other factors, whether the bonding surfaces have formed an intermetallic bond. For example, when bonding occurs, the forces $F_{H1}$, $F_{H2}$, and $F_{V1}$ on the bonding tool increase. This increase indicates to the analyzer circuit 312 that bonding is complete, and the analyzer circuit 314, in turn, sends a request to the signal generator to stop the transducer movement.

A method of ultrasonic bonding within the context of lead frame-interposer integration in accordance with the present invention will now be briefly described. Initially, the interposer is positioned within a cavity within a heat block or other suitable support member. The heat block is then heated to catalyze the bonding process. A lead frame is then placed upon the interposer in an overlapping position. Next, the lead frame's movement relative to the interposer is restrained by a clamping mechanism. By way of example, a suitable clamping mechanism is described in Applicant's co-pending application Ser. No. 08/613,022 (Attorney Docket No. NSC1-P077) filed herewith, which is incorporated by reference herein in its entirety. After the lead frame is restrained, a lead is ultrasonically bonded to an associated trace on the interposer. During this bonding step, a bond quality value is determined and analyzed by the controller 300. The controller 300 then adjusts the bonding energy of the transducer 110 based on the determined bond quality value. The bond quality value is repeatedly determined and the transducer energy is repeatedly adjusted until the bonding is complete for this particular lead and its associated trace on the interposer. While the lead frame is still clamped, the remaining unbonded leads are bonded, in the described manner, one at a time to their associated traces.

A method of ultrasonic bonding that may be used in conjunction with the wire bonding aspect of present invention will now be briefly described. Preferably, the bonding tool takes the form of a capillary that is firmly secured by a capillary holder by a lock screw and is arranged to feed a bonding wire as necessary. Typically, the distal end of the bonding wire is initially ultrasonically bonded to a die pad on an integrated circuit. This is typically accomplished by a process known as ball bonding. When the first end of the bonding wire is firmly adhered to the die pad, the transducer and capillary arrangement is moved to a position over a lead of the lead frame. As the transducer is moved, the bonding wire is fed through the capillary. The bonding wire is then ultrasonically bonded to the associated lead and the continuous feed wire is cut off so that a short and discrete bonding wire is formed between the die pad and the lead. The ultrasonic bonding to the lead is typically done by a process referred to as stitch bonding. During this bonding steps, a bond quality value is determined and analyzed by the controller 300. The controller 300 then adjusts the bonding energy of the transducer 110 based on the determined bond quality value. The bond quality value is repeatedly determined and the transducer energy is repeatedly adjusted until the bonding is complete for this particular lead and its associated die pad.

A method of packaging of a semiconductor device will now be briefly described for the lead frame-interposer integration. First, the lead frame is formed using any available conventional processes. An interposer having a plurality of traces is then formed. The method described above in regard to ultrasonic bonding is used to bond the leads of the lead frame to the traces of the interposer. After the leads are bonded to the traces of the interposer, a die with a plurality of bonding pads is affixed to the interposer. Next, the bonding pads of the die are electrically connected to the leads of the lead frame. The die, leads, and a portion of the interposer are encapsulated using conventional encapsulation materials. Conventional techniques are used to implement these steps for packaging the semiconductor device, as are well known to those of ordinary skill in the art.

The bonding arrangement and methods described for the invention have several advantages over conventional bonding arrangements. For example, the transducer movement may now be effectively controlled. Specifically, before bond or trace destruction occurs, the transducer movement may be stopped by the controller 300. Additionally, this increase in and refinement of transducer control results in the possibility of an increase in the density of leads used for lead frame-interposer integration, as well as wire bonding. Finally, the ability to stop the transducer movement before destruction occurs results in a higher yield during bonding.

Although only one embodiment of the present invention has been described in detail, it should be understood that the present invention may be embodied in many other specific forms without departing from the spirit or scope of the invention. Particularly, the described device may be used in conjunction with a wide variety of bonding processes, in addition to the lead frame-interposer integration and wire bonding processes used in the examples.

The invention has been described in conjunction with an example wherein a lead is ultrasonically bonded to a die pad on an integrated circuit or to the trace on an interposer. It should be appreciated that the same types of improvement would be found when bonding other components. For example, the invention can be used when wire bonding a pair of integrated circuit dies together or when wire bonding a tape lead to a die pad. By way of another example, the invention can be used when bonding a lead to a trace on a ball grid array type substrate. Additionally, a particular bonding tool structure and a particular signal generator arrangement have been described. However, the actual construction of these devices may be varied widely. Therefore, the present examples are to be considered as illustrative and not restrictive, and the invention is not to be limited to the details given herein, but may be modified within the scope of the appended claims.

I claim:

1. A lead frame ultrasonic bonding apparatus suitable for coupling lead frame leads to associated traces on a substrate, the ultrasonic bonding apparatus comprising:

a base;

an ultrasonic transducer supported by the base, the transducer having a longitudinal axis, a bonding tool end, a mounting end that is secured to the base and a support section that is positioned between the bonding tool end and the mounting end;

a bonding tool sized suitably for engaging a lead frame lead to facilitate connecting the lead frame lead to an associated trace on a substrate, the bonding tool being secured to the bonding tool end of the transducer such that actuation of the transducer will cause movement of the bonding tool;

a pair of force sensors for detecting the forces applied to the bonding tool, the force sensors being positioned on opposite sides of the transducer's longitudinal axis, each force sensor having a sensor axis that is arranged at an acute angle relative to the longitudinal axis of the transducer, the force sensors each being arranged to detect forces applied along its sensor axis and outputting a force signal indicative of the detected forces; and a controller for receiving the force signals and for outputting a drive signal to the transducer to facilitate mechanically bonding the selected lead frame lead to its associated trace, wherein the outputted drive signal is controlled at least in part on the basis of the received force signals.

2. A lead frame ultrasonic bonding apparatus as recited in claim 1 wherein the controller detects when the magnitudes of the force signals are decreasing and when the magnitudes decrease a predetermined amount, the controller terminates the transducer's bonding movement.

3. A lead frame ultrasonic bonding apparatus as recited in claim 1 wherein the support takes the form of a plurality of support arms that extend laterally relative to the longitudinal axis of the transducer at an acute angle relative to the longitudinal axis, the transducer being secured to the base by the support arms such that the force sensors are positioned between the support arms and the base.

4. A lead frame ultrasonic bonding apparatus as recited in claim 3 further comprising a plurality of fasteners for securing the support arms to the base.

5. A lead frame ultrasonic bonding apparatus as recited in claim 1 wherein the pair of opposing sensors are positioned substantially 180 degrees apart, wherein a first one of the pair of sensors is more than about 90 degrees relative to the longitudinal axis of the transducer and a second one of the pair of sensors is more than about 270 degrees relative to the longitudinal axis of the transducer.

6. A lead frame ultrasonic bonding apparatus as recited in claim 1, wherein the controller comprises:

a plurality of amplifiers, each amplifier being arranged for receiving an associated force signal and outputting an amplified signal;

an analyzer for receiving the amplified signals from the amplifiers, the analyzer being arranged for determining a bonding quality value based on the analysis of the amplified signals and for outputting an analyzer result; and a signal generator for applying the drive signal to the transducer and for receiving the analyzer result from the analyzer, the signal generator being arranged to permit actuation of the transducer at drive signal values suitable for ultrasonic bonding based on the analyzer result.

7. A lead frame ultrasonic bonding apparatus as recited in claim 1 wherein the transducer is a piezoelectric transducer and the force sensors are piezoelectric transducers.

8. A lead frame ultrasonic bonding apparatus as recited in claim 1 wherein the substrate is one of a group consisting of an interposer, a printed circuit board, and a ball grid array type substrate.

9. An ultrasonic bonder for coupling an integrated circuit die to associated wiring traces, the bonder comprising:

a base;

an ultrasonic transducer supported by the base, the transducer having a longitudinal axis, a bonding tool end, a mounting end that is secured to the base and a support section that is positioned between the bonding tool end and the mounting end;

a capillary holder for supporting a capillary having a bonding wire suitable for electrically connecting a die pad of the integrated circuit die to an associate wiring trace, the capillary holder being secured to the transducer such that actuation of the transducer will cause movement of the capillary supported by the capillary holder;

a pair of force sensors for detecting the forces applied to the capillary holder, the force sensors being positioned on opposite sides of the transducer's longitudinal axis, each force sensor having a sensor axis that is arranged at an acute angle relative to the longitudinal axis of the transducer, the force sensors each being arranged to detect forces applied along its sensor axis and outputting a force signal indicative of the detected forces;

a plurality of amplifiers, each amplifier being arranged for receiving an associated force signal and outputting an amplified signal;

an analyzer for receiving the amplified signals from the amplifiers, the analyzer being arranged for determining a bonding quality value based on the analysis of the amplified signals and for outputting an analyzer result; and a signal generator for applying the drive signal to the transducer and for receiving the analyzer result from the analyzer, the signal generator being arranged to permit actuation of the transducer at drive signal values suitable for ultrasonic bonding based on the analyzer result.

10. An ultrasonic bonder as recited in claim 9 wherein the analyzer detects when the magnitudes of the amplified force signals are decreasing and when the magnitudes decrease a predetermined amount, the analyzer via the signal generator terminates the transducer's bonding movement.

11. An ultrasonic bonder as recited in claim 9 wherein the associated wiring traces take the form of a lead frame in a semiconductor package.

12. An ultrasonic bonder as recited in claim 9 wherein the associated wiring traces take the form of a tape lead in a tape automated bonding semiconductor package.

13. An ultrasonic bonder as recited in claim 9 wherein the associated wiring trace leads take the form of die pads on a second integrated circuit die.

14. An ultrasonic bonder as recited in claim 9 further comprising a capillary that feeds the bonding wire therethrough, the capillary being supported by the capillary holder.

15. An ultrasonic bonder as recited in claim 9 wherein the transducer is a piezoelectric transducer and the force sensors are piezoelectric transducers.

16. A method of bonding a lead of a lead frame to an associated trace on a substrate, the method comprising the steps of:

(a) initiating a ultrasonic bonding of a first lead of the lead frame to a first trace on the substrate, the bonding being at a first ultrasonic energy value;

(b) detecting a plurality of forces on the first lead;

(c) determining a bonding quality based on the detected forces;

(d) continuing the ultrasonic bonding at a second ultrasonic energy value that is based on the determined bonding quality; and (e) repeating steps (b), (c), and (d) until the second ultrasonic energy value is a predetermined value.

17. A method as recited in claim 16 wherein the first ultrasonic energy value varies from the second ultrasonic energy value.

18. A method as recited in claim 16 wherein the substrate is one of a group consisting of an interposer, a printed circuit board, and a ball grid array type substrate.

19. A method for packaging an integrated circuit die having a plurality of die pads, comprising the steps of:

(a) forming a lead frame having a plurality of leads;

(b) forming a substrate having a plurality of traces, the interposer defining a die attach area;

(c) placing said lead frame directly over said substrate such that each lead is aligned directly over one of the plurality of traces on the substrate;

(f) a method as recited in claim 16;

(g) repeating said steps (f) as necessary to connect additional leads on the lead frame to their associated traces on the substrate;

(h) ultrasonically bonding a first end of a bonding wire to an associated one of the die pads, wire bonding a second end of the bonding wire to the selected lead of the lead frame;

(i) repeating said steps (h) as necessary to connect additional bonding pads on the die to their associated leads;

(j) affixing a die in the die attach area; and (k) encapsulating the die, bonding wires, the substrate, and inner portion of the lead frame to form a protective package.

20. A method as recited in claim 19 wherein the substrate is one of a group consisting of an interposer, a printed circuit board, and a ball grid array type substrate.

21. A method as recited in claim 16 wherein the substrate is one of a group consisting of an interposer, a printed circuit board, and a ball grid array type substrate.

22. A method as recited in claim 16 wherein at least one of the substrate traces and the bonding area is plated with a material selected from the group consisting of gold and silver.

* * * * *